(12) United States Patent
Takeda

(10) Patent No.: US 7,586,971 B2
(45) Date of Patent: Sep. 8, 2009

(54) EXTERNAL-CAVITY LASER LIGHT SOURCE APPARATUS AND LASER LIGHT EMISSION MODULE

(75) Inventor: Takashi Takeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/958,456

(22) Filed: Dec. 18, 2007

(65) Prior Publication Data

US 2008/0151949 A1 Jun. 26, 2008

(51) Int. Cl.
*H01S 3/08* (2006.01)
(52) U.S. Cl. .............................. 372/98; 372/22; 372/21; 372/100
(58) Field of Classification Search .................. 372/22, 372/21, 98, 99, 100
See application file for complete search history.

(56) References Cited

U.S. PATENT DOCUMENTS

| 6,586,141 | B1 | 7/2003 | Efimov et al. | |
|---|---|---|---|---|
| 6,673,497 | B2 | 1/2004 | Efimov et al. | |
| 7,322,704 | B2 * | 1/2008 | Shchegrov | 353/94 |
| 2006/0120415 | A1 | 6/2006 | Iwai et al. | |
| 2008/0049299 | A1 * | 2/2008 | Haskett et al. | 359/326 |

FOREIGN PATENT DOCUMENTS

| EP | 0 625 811 A1 | 11/1994 |
|---|---|---|
| EP | 0 738 031 A1 | 10/1996 |
| JP | A 7-45896 | 2/1995 |
| JP | A-07-152055 | 6/1995 |
| JP | A 11-54836 | 2/1999 |
| JP | A-2005-055528 | 3/2005 |
| JP | A 2005-175452 | 6/2005 |
| JP | A-2006-093586 | 4/2006 |
| JP | A 2006-100772 | 4/2006 |

* cited by examiner

*Primary Examiner*—Minsun Harvey
*Assistant Examiner*—Kinam Park
(74) *Attorney, Agent, or Firm*—Oliff & Berridge, PLC

(57) ABSTRACT

An external-cavity laser light source apparatus includes a plurality of laser light emission modules, each including a first mirror, a second mirror reflecting fundamental wave light toward the first mirror, a lasing medium emitting the fundamental wave light, a wavelength converter performing wavelength conversion on incident fundamental wave light to produce first converted light and non-converted light. A third mirror reflects second converted light to produce reflected, converted light, the second converted light being wavelength-converted light produced when the non-converted light is reflected off the second mirror and incident again on the wavelength converter. The plurality of modules are disposed so that the first converted light beams exit the modules in the same direction and the reflected, converted light beams exiting the modules approach each other. A deflector may deflect the reflected, converted light beams exiting from the modules in the same exit direction as the first converted light.

3 Claims, 9 Drawing Sheets

<REFLECTANCE PROPERTIES OF OUTPUT MIRROR 140a>

<REFLECTANCE PROPERTIES OF DEFLECTION MIRROR 120a>

EXTERNAL-CAVITY LASER LIGHT SOURCE APPARATUS AND LASER LIGHT EMISSION MODULE

BACKGROUND

1. Technical Field

The present invention relates to an external-cavity laser light source apparatus with a wavelength converter.

2. Related Art

In recent years, a high-efficiency laser light source apparatus is used in some cases as the illumination light source for projectors, monitoring apparatuses and the like. One example of such a laser light source apparatus has a wavelength converter made of a nonlinear optical crystal or the like, which wavelength-converts infrared light into visible light (green or blue light, for example) as the exit light (see JP-A-2006-100772).

The laser light source apparatus with a wavelength converter described above is configured, for example, in such a way that the light emitted from a laser light source (a semiconductor laser array and a solid state laser apparatus, for example) resonates in a cavity located outside the laser light source and the amplified, more intense laser light is emitted. In such an external-cavity laser light source apparatus, the wavelength converter wavelength-converts part of the light emitted from the laser light source and outputs the converted light to the outside. On the other hand, the light that has not been wavelength-converted in the wavelength converter (non-converted light) is reflected off a mirror that is part of the external cavity, again incident on the lasing medium, and used for amplification. However, when the non-converted light is incident on the wavelength converter in the return path of the external resonance, part of the incident light is wavelength-converted, and the wavelength-converted light incident on the lasing medium is not used for amplification but absorbed therein. It is therefore difficult to efficiently use the wavelength-converted light as an illumination light source.

SUMMARY

An advantage of some aspects of the invention is to provide a technology by which the wavelength-converted light can be efficiently used in an external-cavity laser light source apparatus with a wavelength converter.

An external-cavity laser light source apparatus according to an aspect of the invention includes a plurality of laser light emission modules, each including a first mirror for resonance, a second mirror for resonance, the second mirror reflecting fundamental wave light for external resonance toward the first mirror, a lasing medium disposed between the first mirror and the second mirror, the lasing medium emitting the fundamental wave light, a wavelength converter disposed between the lasing medium and the second mirror, the wavelength converter performing wavelength conversion on the incident fundamental wave light to produce first converted light that has undergone the wavelength conversion and non-converted light that has not undergone the wavelength conversion, and a third mirror disposed between the lasing medium and the wavelength converter, the third mirror reflecting second converted light in a predetermined direction to produce reflected, converted light, the second converted light being wavelength-converted light produced when the non-converted light is reflected off the second mirror and incident again on the wavelength converter. The plurality of laser light emission modules are disposed in such a way that the first converted light beams exit from the laser light emission modules in the same direction and the reflected, converted light beams that exit from the laser light emission modules approach each other. The external-cavity laser light source apparatus further includes a deflector that deflects the reflected, converted light beams that exit from the laser light emission modules in the same exit direction as the first converted light.

In the external-cavity laser light source apparatus according to the above aspect of the invention, since the second converted light is reflected off the third mirror as the exit light and deflected in the same exit direction as the first converted light, the second converted light can be used without being absorbed in the lasing medium, allowing efficient use of the wavelength-converted light. Further, since the reflected, converted light beams that exit from the laser light emission modules approach one another, the distances among the reflected, converted light beams deflected off the deflector can be reduced to relatively small values, allowing the size of the optical system downstream of the laser light emission modules to be reduced to a relatively small value.

In the external-cavity laser light source apparatus described above, the deflector may be provided separately from the plurality of laser light emission modules, and the deflector may have a plurality of deflection surfaces and cause the reflected, converted light beams that exit from the plurality of laser light emission modules to be deflected off the different deflection surfaces in the same exit direction as the first converted light.

With such a configuration, the reflected, converted light beams that exit from the laser light emission modules can be deflected in the same direction as the first converted light, allowing efficient use of the wavelength-converted light.

In the external-cavity laser light source apparatus described above, the third mirror in each of the laser light emission modules may function as the deflector.

With such a configuration, to deflect the reflected, converted light in the same exit direction as the first converted light, the deflector may not be provided separately from the laser light emission modules. The number of parts can thus be reduced as compared to the configuration in which the deflector is provided separately from the laser light emission modules, allowing reduction in the size of the external-cavity laser light source apparatus. Further, since the distance between any two of the laser light emission modules can be reduced to a relatively small value, the distance between the reflected, converted light beams after deflection can be reduced to a relatively small value, allowing the size of the optical system downstream of the laser light emission modules to be reduced to a relatively small value.

In the external-cavity laser light source apparatus described above, in at least one of the plurality of laser light emission modules, the reflected, converted light deflected off the third mirror, which functions as the deflector, in the same exit direction as the first converted light may travel along the light path that does not pass through the wavelength converter.

With such a configuration, in at least one of the laser light emission modules, it is possible to prevent the reflected, converted light deflected off the third mirror from being absorbed in the wavelength converter, and hence the usage efficiency of the reflected, converted light from being reduced. In such a laser light emission module, since the reflected, converted light deflected off the third mirror does not enter the wavelength converter, it is possible to prevent degradation of the wavelength converter, for example, due to the heat generated by the reflected, converted light. Further, by reducing the thickness of the wavelength converter to allow the reflected, converted light to travel along the light path that does not pass through the wavelength converter, the size of the laser light emission module can be reduced, allowing reduction in the size of the whole external-cavity laser light source apparatus.

The invention can be implemented not only in the form of the external-cavity laser light source apparatuses described above, but also in the form of the laser light emission module used in the external-cavity laser light source apparatus.

BRIEF DESCRIPTION OF THE DRAWINGS

The invention will now be described with reference to the accompanying drawings, wherein like numbers refer to like elements.

FIGS. 3A and 3B are explanatory views diagrammatically showing the reflectance properties of the output mirror 140a and the deflection mirror 120a;

DESCRIPTION OF EXEMPLARY EMBODIMENTS

The best mode for carrying out the invention will be described below with reference to the embodiments in the following order:
A. First Embodiment
B. Second Embodiment
C. Third Embodiment
D. Fourth Embodiment
E. Fifth Embodiment
F. Sixth Embodiment
G. Seventh Embodiment
H. Variations

A. First Embodiment

Figure 1:
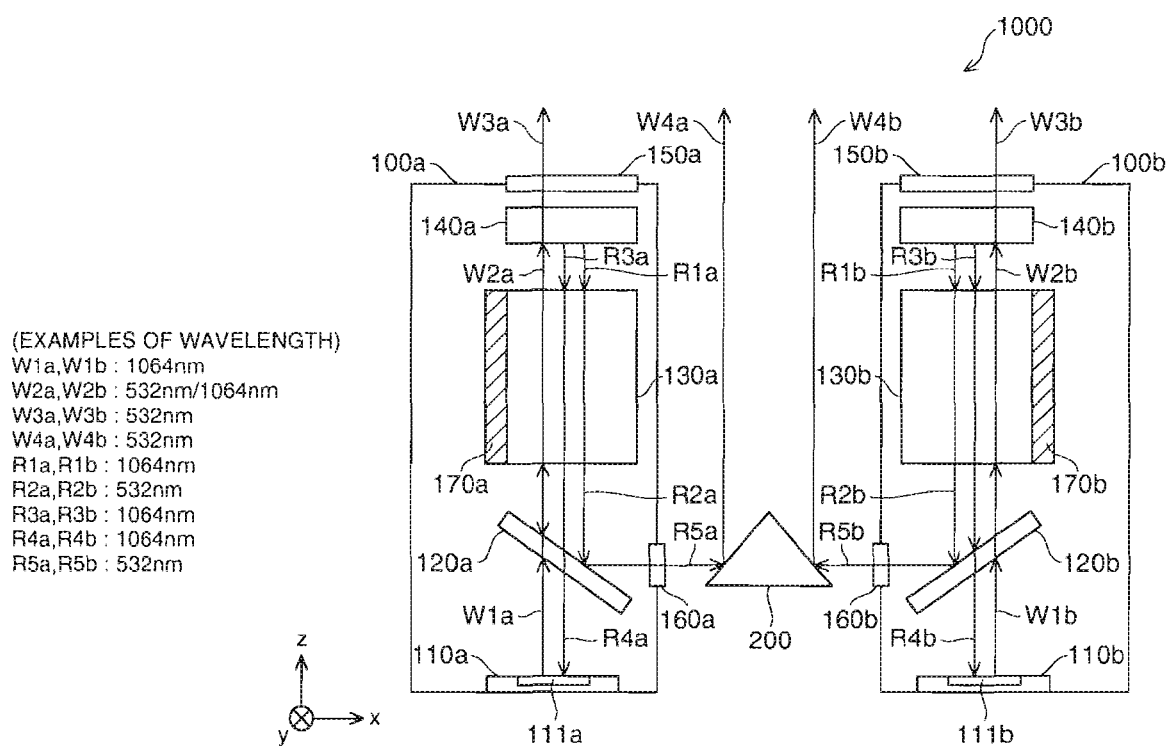
FIG. 1 is an explanatory view showing a schematic configuration of the external-cavity laser light source apparatus as an embodiment of the invention.

FIG. 1 is an explanatory view showing a schematic configuration of the external-cavity laser light source apparatus as an embodiment of the invention. The external-cavity laser light source apparatus 1000 includes a laser light emission module 100a, a laser light emission module 100b, and a deflection prism 200 disposed between the two laser light emission modules 100a and 100b. The two laser light emission modules 100a and 100b are disposed on opposite sides of the prism 200 in a symmetric manner. The prism 200 has a plurality of deflection surfaces, each of which has a reflective film formed thereon. The light (visible light) incident on any of the deflection surfaces is totally reflected.

The laser light emission module 100a includes a semiconductor laser arrays 110a, a deflection mirror 120a, a wavelength converter 130a, an output mirror 140a, an exit window 150a, an exit window 160a, and a Peltier element 170a. The exit windows 150a and 160a are made of polished optical glass. The Peltier element 170a is glued to, among the side surfaces of the wavelength converter 130a, the side surface opposite to the exit window 160a. The semiconductor laser array 110a has a one-dimensional array structure in which a plurality of laser elements 111a are aligned along the Y axis.

Figure 2:
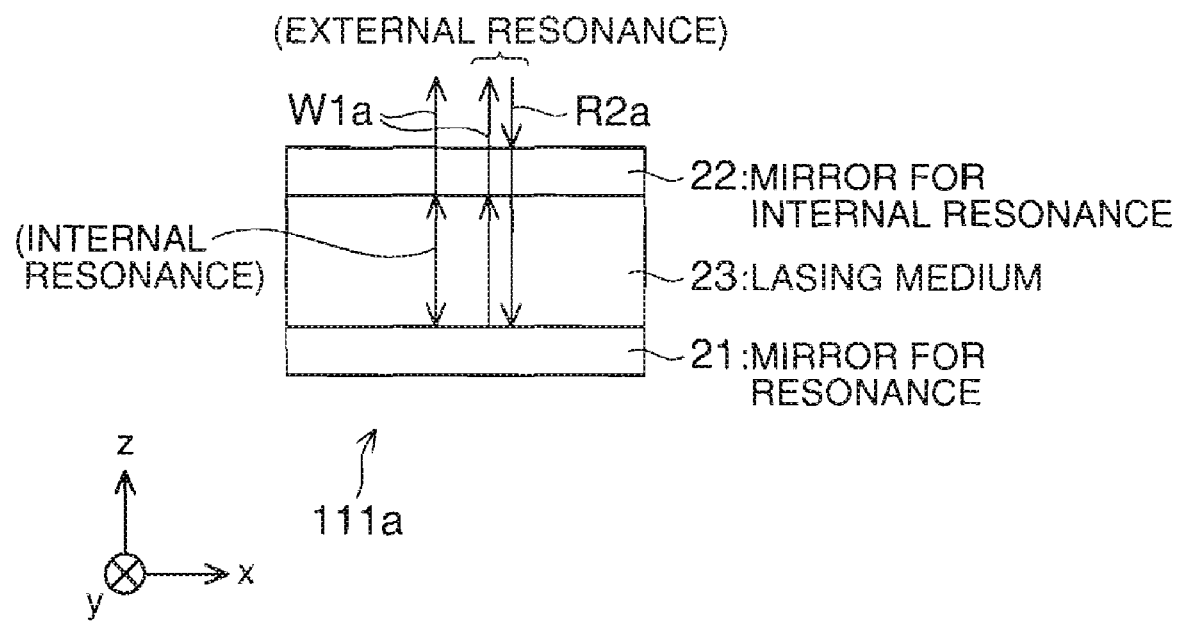
FIG. 2 is an explanatory view schematically showing the internal structure of the laser element 111a shown in FIG. 1.

FIG. 2 is an explanatory view schematically showing the internal structure of the laser element 111a shown in FIG. 1. The laser element 111a is a vertical cavity surface emitting laser (VCSEL) element including a mirror for resonance 21, a mirror for internal resonance 22, and a lasing medium 23 formed of a clad layer, an active layer and the like. The laser element 111a produces laser light (hereinafter referred to as "fundamental laser light") in a resonance process that occurs between the mirror for resonance 21 and the mirror for internal resonance 22 (hereinafter referred to as "internal resonance"), and emits the laser light along the Z-axis. The mirror for internal resonance 22 transmits part of the internal resonance light, so that it serves as an output window for the fundamental laser light in the laser element 111a. The mirror for resonance 21 is a total reflection mirror and used for internal resonance that occurs between the mirror for resonance 21 and the mirror for internal resonance 22. The mirror for resonance 21 and the output mirror 140a (FIG. 1) are used in a pair to form an external cavity.

The wavelength converter 130a (FIG. 1) causes the second harmonic generation (SHG) phenomenon, that is, a secondary nonlinear optical phenomenon in which two photons are converted into one photon having a frequency twice the original frequency (converted into light having a wavelength one-half the original wavelength). The wavelength converter 130a is made of a ferroelectric material with a polarization-reversed structure formed therein. An example of the material of the wavelength converter 130a is PPLN (Periodically Poled $LiNb_3$). The wavelength converter 130a exhibits temperature dependence on the wavelength of the limit for wavelength conversion. To address this problem, in the laser light emission module 100a, the Peltier element 170a is used to cool the wavelength converter 130a so that the temperature of the wavelength converter 130a is kept at a fixed value. The temperature-stabilized wavelength converter 130a then performs wavelength conversion on the light having a predetermined wavelength. The Peltier element 170a is driven by a temperature controller (not shown) that controls the current flowing through the Peltier element 170a. The wavelength conversion efficiency of the wavelength converter 130a is assumed to be 20% at the fixed temperature obtained by the Peltier element 170a. Alternatively, the Peltier element 170a can be replaced with or used with a heater to keep the temperature of the wavelength converter 130a at a fixed value.

"External-cavity" in the external-cavity laser light source apparatus 1000 means that the light emitted from the semiconductor laser array 110a resonates for amplification in a cavity provided external to the semiconductor laser array 110a. That is, in the laser light emission module 100a, the external cavity formed of the output mirror 140a and the mirror for resonance 21 (FIG. 2) causes the fundamental laser light emitted from the laser element 111a to further resonate for amplification, and the amplified light is emitted as higher-power laser light. Specifically, the fundamental laser light W1a (wavelength: 1064 nm) emitted from the laser element 111a passes through the deflection mirror 120a, enters the wavelength converter 130a, and exits from the wavelength converter 130a as the light W2a. Since the conversion efficiency of the wavelength converter 130a is 20%, 20% of the light W1a is converted into the light having a wavelength of 532 nm. Part of the remainder of the light W1a (approximately 1%) is absorbed in the wavelength converter 130a. The remainder of the light W1a that has not been converted nor absorbed in the wavelength converter 130a (approximately 79% of the light W1a) will pass through the wavelength converter 130a. The light W2a therefore contains the wavelength-converted light (wavelength: 532 nm) and the non-wavelength-converted light (wavelength: 1064 nm).

Figure 3A:
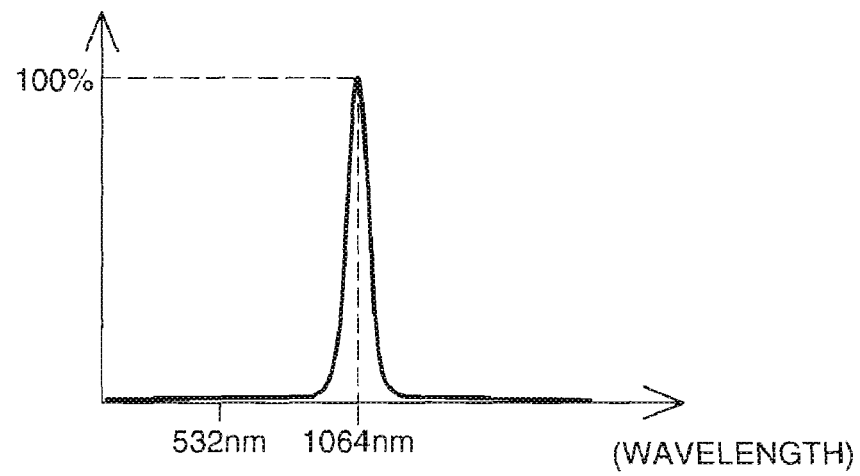

FIG. 3A is an explanatory view diagrammatically showing the reflectance properties of the output mirror 140a shown in FIG. 1. The output mirror 140a is formed of a glass substrate with a dielectric thin film layer (such as a $TiO_2$ layer and a $SiO_2$ layer) formed thereon. The output mirror 140a shows locally high reflectance in a predetermined-width wavelength region having a center wavelength of 1064 nm, while showing low reflectance outside that wavelength region. Therefore, among those contained in the light W2a (FIG. 1), the light having a wavelength of 1064 nm (infrared light) is totally reflected, while the light having a wavelength of 532 nm (green light) substantially passes through the output mirror 140a and exits out of the laser light emission module 100a.

The light R1a and the light R3a (wavelength: 1064 nm) reflected off the output mirror 140a are again incident on the wavelength converter 130a. Although the light R1a and the light R3a are identical to each other, they are differently labeled for convenience of explanation. The light R1a is wavelength-converted in the wavelength converter 130a into the light R2a having a wavelength of 532 nm, and is incident on the deflection mirror 120a. On the other hand, the light R3a is not wavelength-converted in the wavelength converter 130a but passes therethrough, and is incident on the deflection mirror 120a.

Figure 3B:
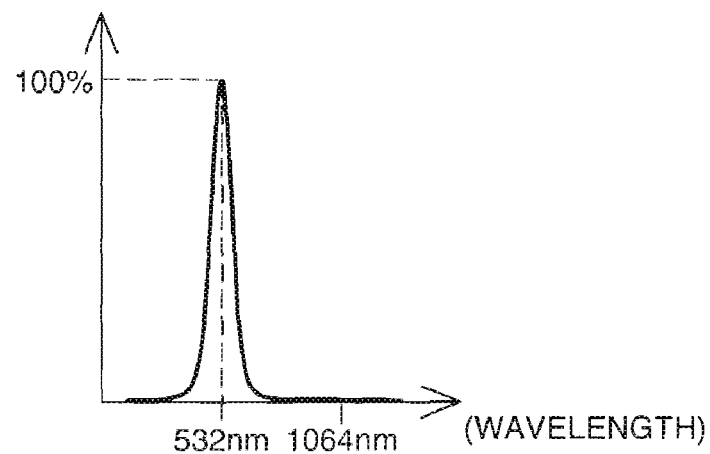

FIG. 3B is an explanatory view diagrammatically showing the reflectance properties of the deflection mirror 120a shown in FIG. 1. The deflection mirror 120a shows locally high reflectance in a predetermined-width wavelength region having a center wavelength of 532 nm, while showing low reflectance outside that wavelength region. The light R2a (FIG. 1) having a wavelength of 532 nm is therefore reflected off the deflection mirror 120a. The deflection mirror 120a is inclined to the optical axis of the light R2a by a predetermined angle (45 degrees), so that the optical axis of the light R2a is bent by 90 degrees at the deflection mirror 120a and the light R2a exits through the exit window 160a to the outside of the laser light emission module 100a. On the other hand, the light R3a having a wavelength of 1064 nm passes through the deflection mirror 120a and is incident on the laser element 111a. Then, the light R3a incident on the laser element 111a is amplified in the laser element 111a.

The light R5a that exits through the exit window 160a is reflected off the prism 200, travels as the light W4a in the same direction as the light W2a, and exits out of the external-cavity laser light source apparatus 1000. While the above description has been made of the laser light emission module 100a, the same description applies to the laser light emission module 100b.

The mirror for resonance 21 (FIG. 2) described above corresponds to the first mirror in the claims. The output mirror 140a (140b) corresponds to the second mirror in the claims. The deflection mirror 120a (120b) corresponds to the third mirror in the claims. The prism 200 corresponds to the deflector in the claims. The part of the light W1a (W2b) that has a wavelength of 532 nm corresponds to the first converted light in the claims. The part of the light W2a (W2b) that has a wavelength of 1064 nm corresponds to the non-converted light in the claims. The light R2a (R2b) corresponds to the second converted light in the claims. The light R5a (R5b) corresponds to the reflected, converted light in the claims.

As described above, in the external-cavity laser light source apparatus 1000, the light R2a (R2b) wavelength-converted along the return path in the external resonance (output mirrors 140a, 140b→mirror for resonance 21) is not absorbed in the laser element 111a (111b) but used as the exit light to the outside of the external-cavity laser light source apparatus 1000. The wavelength-converted light can therefore be efficiently used in the external-cavity laser light source apparatus 1000. The prism 200 for deflecting the light R5a and R5b in the same direction as the light W2a and W2b is shared by the laser light emission modules 100a and 100b. The number of parts can therefore be reduced as compared to the configuration in which a prism is prepared for each of the laser light emission modules 100a and 100b. Further, the distance between the light beams W4a and W4b can be reduced to a relatively small value as compared to the configuration in which a prism is prepared for each of the laser light emission modules 100a and 100b. The size of the optical system (not shown) downstream along the light W4a and W4b can thus be reduced, so that the size of the whole external-cavity laser light source apparatus 1000 can be reduced. The Peltier element 170a (170b) is glued to the side surface opposite to the exit window 160a (160b) among the side surfaces of the wavelength converter 130a (130b). The distance between the deflection mirror 120a (120b) and the exit window 160a (160b) can thus be reduced as compared to the case where the Peltier element 170a (170b) is glued to the side surface on the same side as the exit window 160a (160b), so that the size of the external-cavity laser light source apparatus 1000 can be reduced.

B. Second Embodiment

Figure 4:
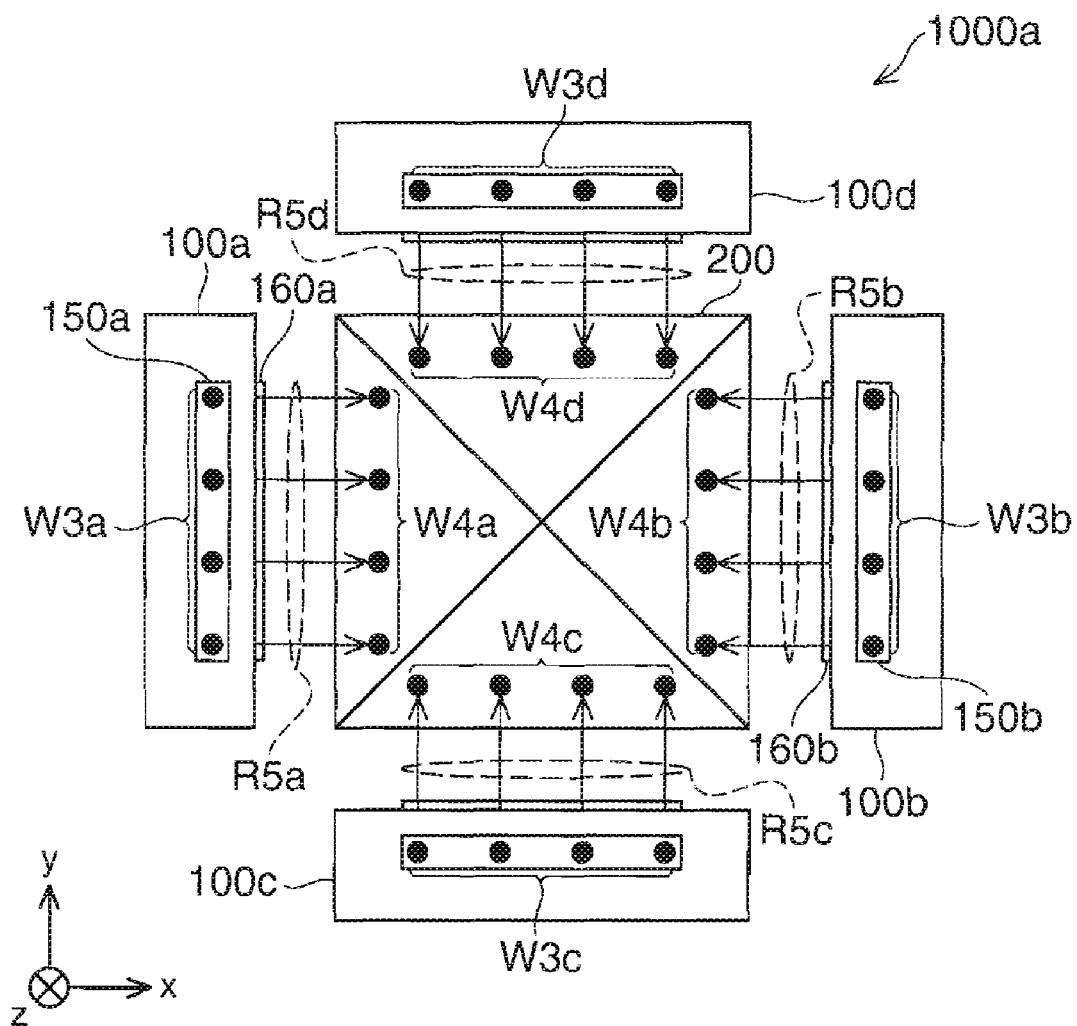
FIG. 4 is an explanatory view showing a schematic configuration of the external-cavity laser light source apparatus in a second embodiment.

FIG. 4 is an explanatory view showing a schematic configuration of the external-cavity laser light source apparatus in a second embodiment. The external-cavity laser light source apparatus 1000a has the same configuration as that of the external-cavity laser light source apparatus 1000 (FIG. 1) in the first embodiment except that the number of laser light emission modules is four.

The external-cavity laser light source apparatus 1000a includes four laser light emission modules 100a, 100b, 100c, and 100d. The laser light emission modules 100a and 100b in this embodiment are identical to the laser light emission modules 100a and 100b shown in FIG. 1. The configuration of the laser light emission module 100c is the same as that of the laser light emission module 100a, and the configuration of the laser light emission module 100d is the same as that of the laser light emission module 100b. FIG. 4 shows the external-cavity laser light source apparatus 1000a viewed in the direction in which the light exits (Z axis direction) The laser light emission module 100a emits the light W3a. Similarly, the laser light emission modules 100b, 100c, and 100d emit the light W3b, W3c, and W3d, respectively. The light R5a is reflected off the prism 200 and emitted as the light W4a. Similarly, the light R5b, R5c, and R5d are reflected off the prism 200 and emitted as the light W4b, W4c, and W4d, respectively.

Such a configuration can provide a greater amount of light than the configuration in which two laser light emission modules 100a and 100b are used for emission. In such a configuration, the distance between the light beams W4a and W4b as well as the distance between the light beams W4c and W4d can be maintained to the substantially same level in the first embodiment, so that the size of the optical system (not shown) downstream along the light W4a to W4d can be substantially the same as that in the first embodiment.

C. Third Embodiment

Figure 5:
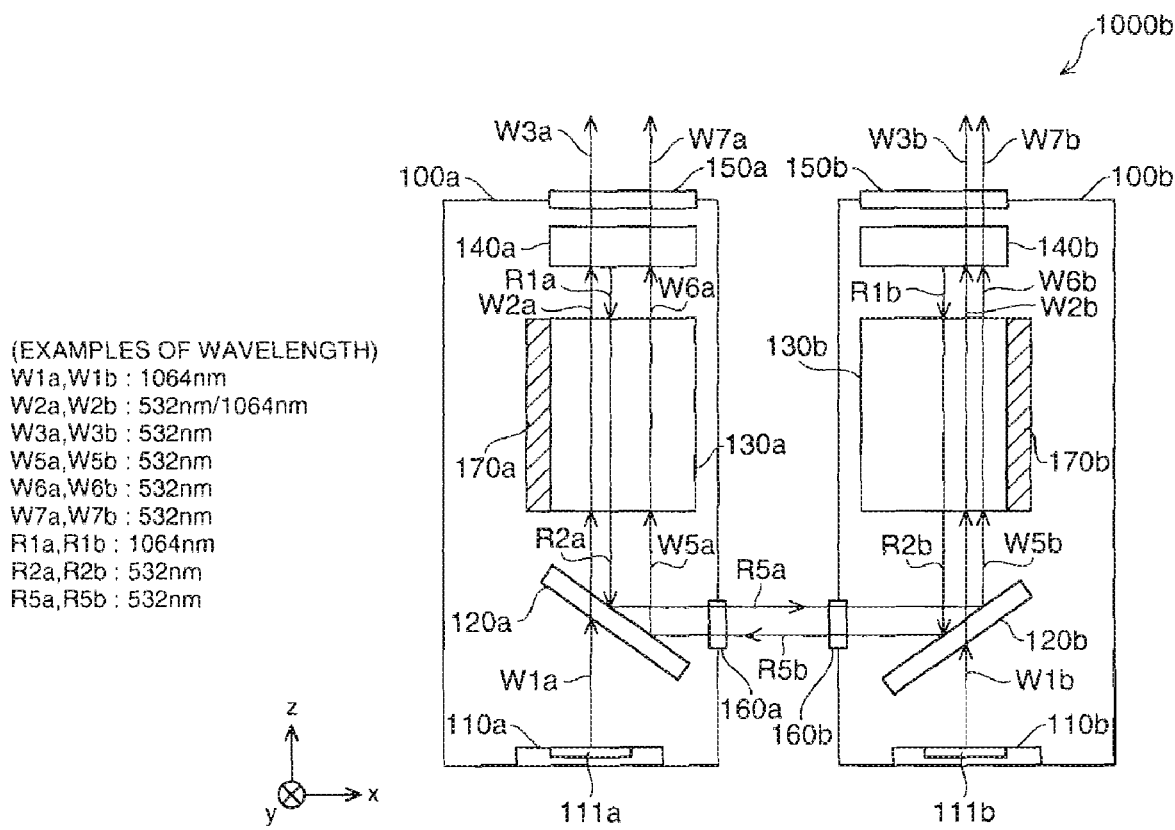
FIG. 5 is an explanatory view showing a schematic configuration of the external-cavity laser light source apparatus in a third embodiment.

FIG. 5 is an explanatory view showing a schematic configuration of the external-cavity laser light source apparatus in a third embodiment. The external-cavity laser light source apparatus 1000b has the same configuration as that of the external-cavity laser light source apparatus 1000 (FIG. 1) except that the external-cavity laser light source apparatus 1000b includes no prism 200 and the position of the deflection mirror 120b in the laser light emission module 100b is shifted. Although the prism 200 is used to deflect the light R5a (R5b) so that it travels in the same direction as the light W3a (W3b) in the first embodiment, the prism 200 is replaced with the deflection mirrors 120b (120a) of the opposite laser light emission module in the external-cavity laser light source apparatus 1000b. That is, the deflection mirror of the laser light emission module functions as the prism 200 in the first embodiment. In FIG. 5, the light R3a (R3b) and the light R4a (R4b) are omitted for convenience of illustration.

Specifically, in the laser light emission module 100a, the light R2a wavelength-converted along the return path in the external resonance is reflected off the deflection mirror 120a and exits through the exit window 160a as the light R5a. Since the external-cavity laser light source apparatus 1000b has no prism 200 unlike the first embodiment, the light R5a passes through the exit window 160b and enters the laser light emission module 100b. The light R5a that has entered the laser light emission module 100b is reflected off the deflection mirror 120b and incident on the wavelength converter 130b as the light W5b. Since the light W5b has a wavelength of 532 nm, it will not be wavelength-converted in the wavelength converter 130b but passes therethrough. The transmitted light W6b passes through the output mirror 140b and exits to the outside as the light W7b.

Similarly, in the laser light emission module 100b, the light R5b exits through the exit window 160b, passes through the exit window 160a, and enters the laser light emission module 100a. Then, the light R5b is deflected off the deflection mirror 120a, passes through the wavelength converter 130a and the output mirror 140a, and exits to the outside as the light W7a. It is noted that the deflection mirror 120b is shifted from the deflection mirror 120a in the −Z direction. Therefore, in the laser light emission module 100a, for example, the position where the light R2a is deflected off the deflection mirror 120a differs from the position where the light R5b is deflected off the deflection mirror 120a. Similarly, in the laser light emission module 100b, the position where the light R2b is deflected off the deflection mirror 120b differs from the position where the light R5a is deflected off the deflection mirror 120b.

The configuration described above allows reduction in the distance between the laser light emission modules 100a and 100b as compared to the configuration with the prism 200. The distances among the light W3a, W3b, W7a, and W7b that exit from the external-cavity laser light source apparatus 1000b can thus be reduced to relatively small values, so that the size of the optical system (not shown) downstream along the light W3a, W3b, W7a, and W7b can be reduced to a relatively small size. The number of parts can also be reduced as compared to the configuration with the prism 200, so that the size of the whole external-cavity laser light source apparatus 1000b can be reduced.

D. Fourth Embodiment

Figure 6:
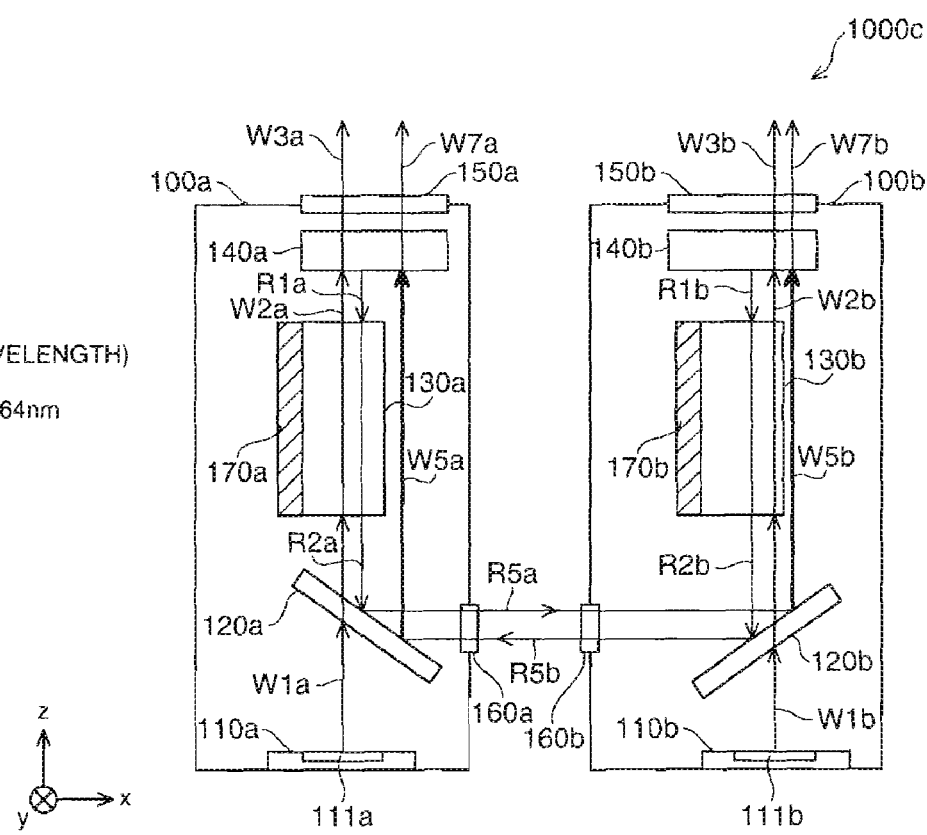
FIG. 6 is an explanatory view showing a schematic configuration of the external-cavity laser light source apparatus in a fourth embodiment.

FIG. 6 is an explanatory view showing a schematic configuration of the external-cavity laser light source apparatus in a fourth embodiment. The external-cavity laser light source apparatus 1000c has the same configuration as that of the external-cavity laser light source apparatus 1000b (FIG. 5) in third embodiment except that the positions where the wavelength converter 130a (130b) and the Peltier element 170a (170b) are disposed are different. In FIG. 6, the light R3a (R3b) and the light R4a (R4b) are omitted for convenience of illustration. In the third embodiment, the light R5b (R5a) coming from the opposite laser light emission module 100b (100a) is deflected off the deflection mirror 120a (120b) and incident on the wavelength converter 130a (130b). As described above, since part of the light incident on the wavelength converter 130a (130b) is absorbed therein, part of the light W5a (W5b) is absorbed in the wavelength converter 130a (130b), so that the light usage efficiency is lowered. In contrast, the fourth embodiment is configured in such a way that the light W5a (W5b) is not absorbed in the wavelength converter 130a (130b).

Specifically, the thickness of the wavelength converter 130a (FIG. 6) in the X axis direction is smaller than the thickness of the wavelength converter 130a (FIG. 1) in the first embodiment. Only the light W2a, R1a, and R3a (not shown) pass through the wavelength converter 130a, and the light W5a travels along the light path that does not pass through the wavelength converter 130a. Similarly, in the laser light emission module 100b, the thickness of the wavelength converter 130b in the X axis direction is smaller than the thickness of the wavelength converter 130b (FIG. 1) in the first embodiment. Only the light W2b, R1b, and R3b (not shown) pass through the wavelength converter 130b, and the light W5b travels along the light path that does not pass through the wavelength converter 130b. In the laser light emission module 100b, the Peltier element 170b is disposed on the side surface of the wavelength converter 130b on the same side as the exit window 160b in such a way that the Peltier element 170b is not located next to the light path of the light W5b.

In the configuration described above, since the light W5a (W5b) travels along the light paths that do not enter the wavelength converter 130a (130b), the light W5a (W5b) will not be absorbed in the wavelength converter 130a (130b). It is therefore possible to prevent the reduction in usage efficiency of the light W5a (W5b). Further, since the light W5a (W5b) is not incident on the wavelength converter 130a (130b), it is possible to prevent degradation of the wavelength converter 130a (130b) due to the heat generated by the light W5a (W5b). Moreover, since the thickness of the wavelength converter 130a (130b) can be reduced, the size of the laser light emission module 100a (100b) can be reduced.

E. Fifth Embodiment

Figure 7:
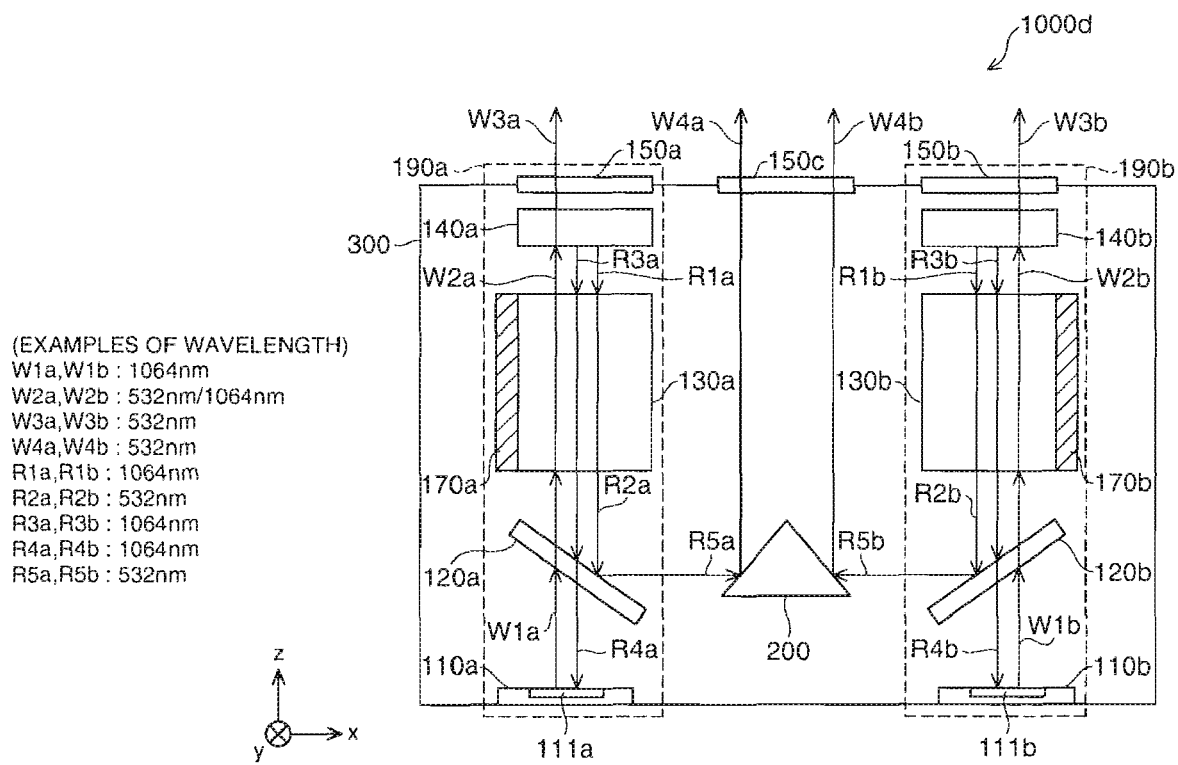
FIG. 7 is an explanatory view showing a schematic configuration of the external-cavity laser light source apparatus in a fifth embodiment.

FIG. 7 is an explanatory view showing a schematic configuration of the external-cavity laser light source apparatus in a fifth embodiment. The external-cavity laser light source apparatus 1000d has the same configuration as that of the external-cavity laser light source apparatus 1000 (FIG. 1) in first embodiment except that a laser light emission unit 190a corresponding to the laser light emission module 100a (FIG.

1) and a laser light emission unit 190b corresponding to the laser light emission module 100b (FIG. 1) are housed in one enclosure 300. In this configuration, each of the laser light emission units 190a and 190b correspond to the laser light emission module in the claims.

In the above configuration as well, the light R2a (R2b) wavelength-converted along the return path in the external resonance is not absorbed in the laser element 111a (111b) but can be used as (illumination) light that exits to the outside of the external-cavity laser light source apparatus 1000d. Housing the laser light emission units 190a and 190b in one enclosure allows the distance between the laser light emission units 190a and 190b to be relatively small. The distances among the light beams emitted from the external-cavity laser light source apparatus 1000d can thus be reduced as compared to the external-cavity laser light source apparatus 1000 (FIG. 1). The size of the optical system (not shown) downstream along the light emitted from the external-cavity laser light source apparatus 1000d can thus be reduced.

F. Sixth Embodiment

Figure 8:
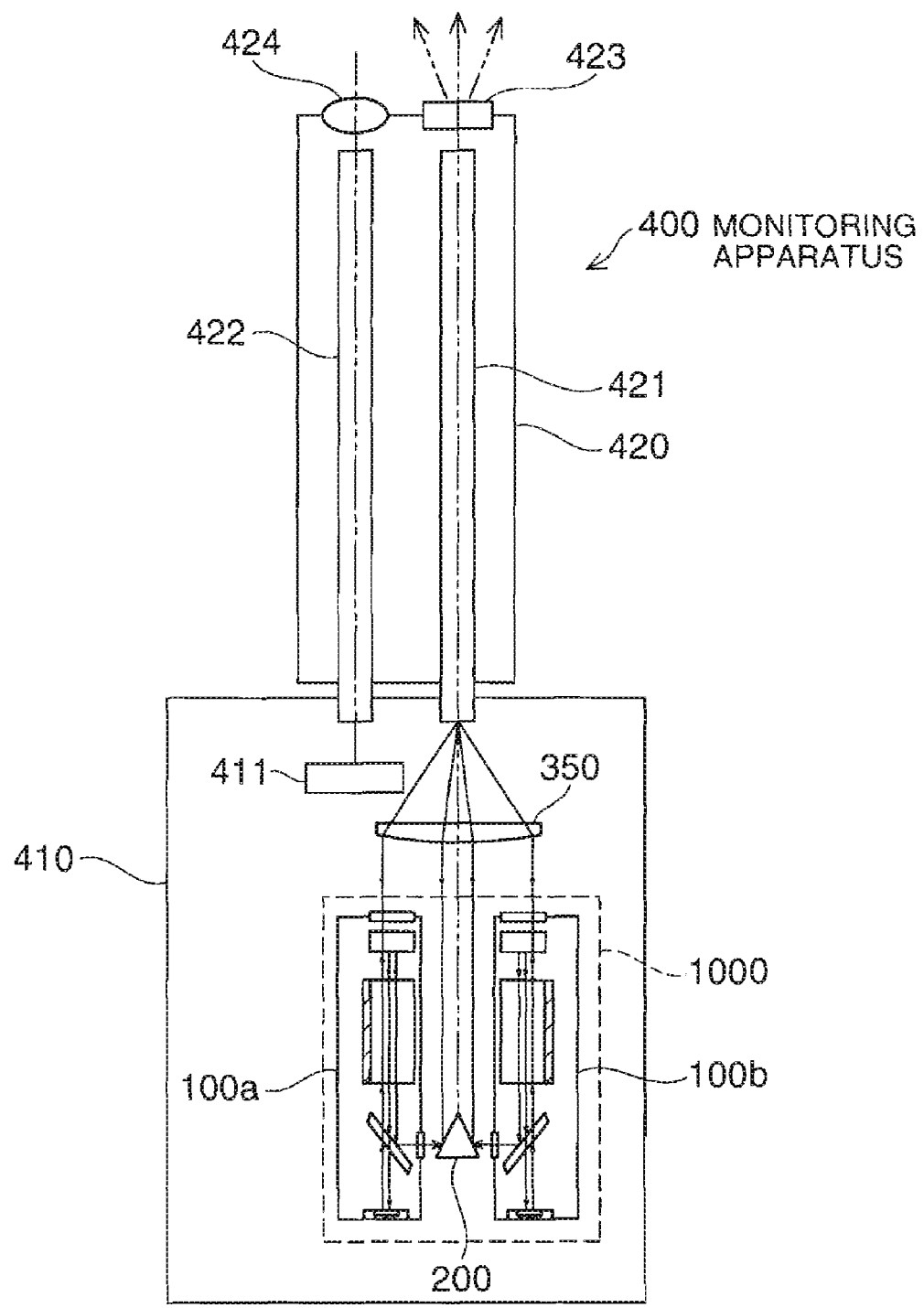
FIG. 8 is a schematic configuration diagram of a monitoring apparatus to which the external-cavity laser light source apparatus according to an embodiment of the invention is applied.

FIG. 8 is a schematic configuration diagram of a monitoring apparatus to which the external-cavity laser light source apparatus of the invention is applied. The monitoring apparatus 400 includes an apparatus body 410 and a light transmitter 420. The apparatus body 410 includes the external-cavity laser light source apparatus 1000 (FIG. 1) in the first embodiment described above. The apparatus body 410 further includes a collector lens 350 and a camera 411.

The light transmitter 420 includes a light-originating light guide 421 and a light-receiving light guide 422. Each of the light guides 421 and 422 is formed of a large number of bundled optical fibers and can transmit laser light to a distant location. The external-cavity laser light source apparatus 1000 is disposed at the entrance of the light-originating light guide 421, and a diffuser 423 is disposed at the exit on the opposite side. An imaging lens 424 is disposed at the entrance of the light-receiving light guide 422.

The laser light emitted from the external-cavity laser light source apparatus 1000 is collected by the collector lens 350, travels through the light guide 421, is diffused by the diffuser 423, and irradiates a subject. The light reflected off the subject is incident on the imaging lens 424 and travels through the light guide 422 to the camera 411. The camera 411 can thus capture an image based on the reflected light obtained by irradiating the subject with the laser light emitted from the laser light source apparatus 1000. It is noted that in the monitoring apparatus 400, the external-cavity laser light source apparatus 1000 may be replaced with any of the external-cavity laser light source apparatuses 1000a to 1000d described above.

G. Seventh Embodiment

Figure 9:
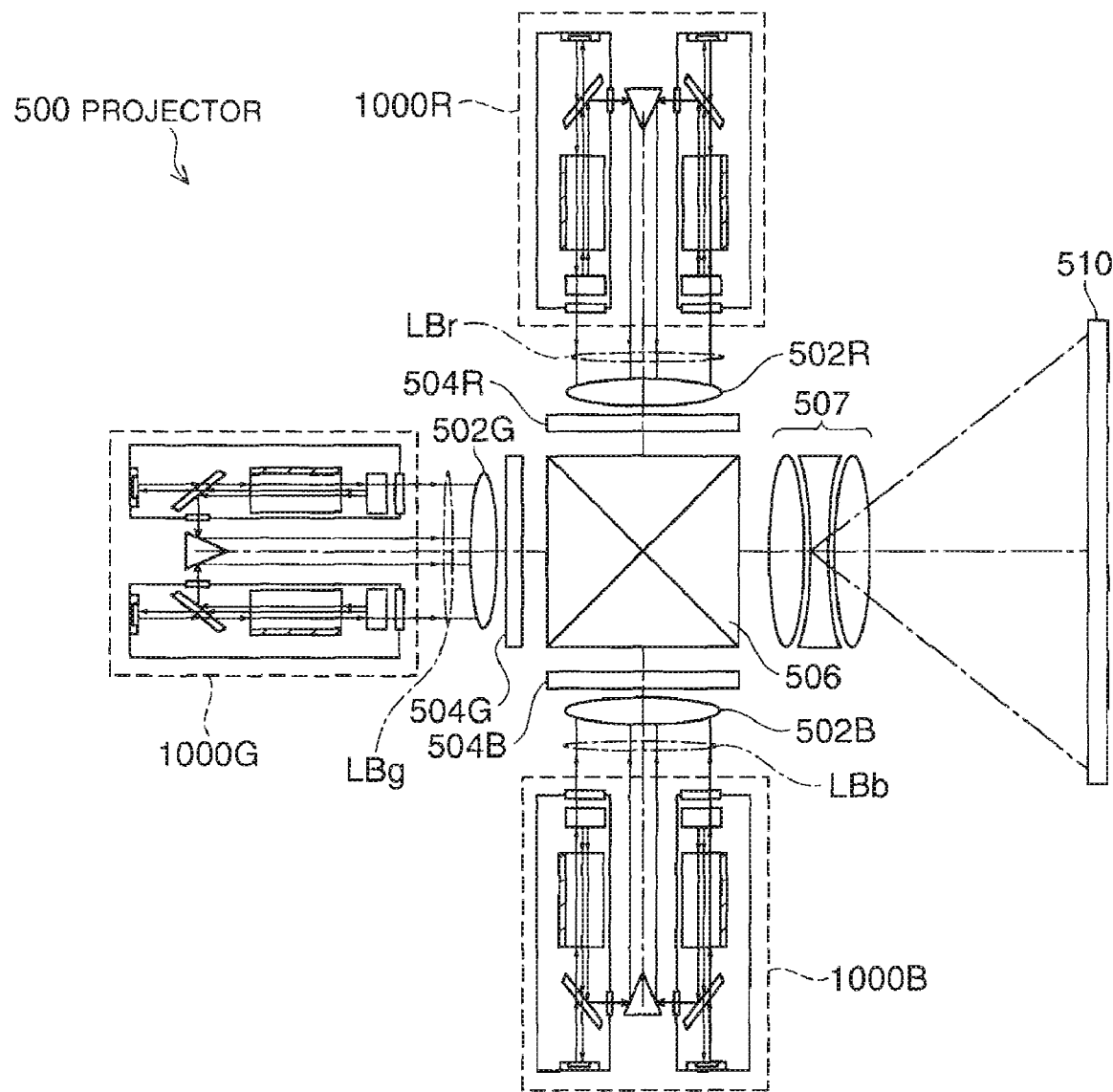
FIG. 9 is a schematic configuration diagram of a projector to which the external-cavity laser light source apparatus according to an embodiment of the invention is applied.

FIG. 9 is a schematic configuration diagram of a projector to which the external-cavity laser light source apparatus of the invention is applied. The projector 500 includes a laser light source apparatus 1000R that emits red light, a laser light source apparatus 1000G that emits green light, and a laser light source apparatus 1000B that emits blue light. The laser light source apparatus 1000R differs from the external-cavity laser light source apparatus 1000 (FIG. 1) in that the central wavelength of the fundamental laser light emitted from the laser element is 1270 nm. The laser light source apparatus 1000R further differs from the external-cavity laser light source apparatus 1000 in that the wavelength converter performs wavelength conversion and produces red light having a wavelength of 635 nm; the output mirror snows high reflectance in a local region having a central wavelength of 1270 nm; and the deflection mirror shows high reflectance in a local region having a central wavelength of 532 nm. The laser light source apparatus 1000G has the same configuration as that of the external-cavity laser light source apparatus 1000 (FIG. 1). The laser light source apparatus 1000B differs from the external-cavity laser light source apparatus 1000 (FIG. 1) in that the central wavelength of the fundamental laser light emitted from the laser element is 900 nm. The laser light source apparatus 1000B further differs from the external-cavity laser light source apparatus 1000 in that the wavelength converter performs wavelength conversion and produces blue light having a wavelength of 450 nm; the output mirror shows high reflectance in a local region having a central wavelength of 900 nm; and the deflection mirror shows high reflectance in a local region having a central wavelength of 450 nm.

The projector 500 further includes liquid crystal light valves 504R, 504G, and 504B that modulate, according to image signals sent from a personal computer or the like (not shown), the color laser light LBr, LBg, and LBb emitted from the external-cavity laser light source apparatuses 1000R, 1000G, and 100B. The projector 500 further includes a cross dichroic prism 506 and a projection lens 507. The cross dichroic prism 506 combines the light beams that exit through the liquid crystal light valves 504R, 504G, and 504B.

The projector 500 further includes homogenizing optical systems 502R, 502G, and 502B disposed downstream of the external-cavity laser light source apparatuses 1000R, 1000G, and 1000B along the respective light paths in order to homogenize the intensity distribution of the laser light emitted from the external-cavity laser light source apparatuses 1000R, 1000G, and 1000B. The projector 500 uses the light having an intensity distribution homogenized by the homogenizing optical systems 502R, 502G, and 502B to irradiate the liquid crystal light valves 504R, 504G, and 504B. Each of the homogenizing optical systems 502R, 502G, and 502B can be formed of, for example, the combination of a hologram and a filed lens.

The three color light beams modulated by the liquid crystal light valves 504R, 504G, and 504B are incident on the cross dichroic prism 506. The cross dichroic prism 506 is formed by bonding four rectangular prisms and has internal surfaces that intersect each other. One of the internal surfaces has a dielectric multilayer film that reflects red light, and the other internal surface has a dielectric multilayer film that reflects blue light. The combined light is projected through the projection lens 507 onto a screen 510 to display an enlarged image.

In each of the external-cavity laser light source apparatuses 1000R, 1000G, and 1000B, the light wavelength-converted along the return path in the external resonance is used to irradiate the corresponding one of the liquid crystal light valves 504R, 504G, and 504B. The wavelength-converted light can thus be efficiently used in the whole projector 500. In the projector 500, the external-cavity laser light source apparatuses 1000R, 1000G, and 1000B may be replaced with any of the external-cavity laser light source apparatuses 1000a to 1000d described above.

H. Variations

Among the components in the above embodiments, the elements other than those claimed in the independent claims are additional elements and can be omitted as appropriate. The invention is not limited to the above embodiments, but can be implemented in various aspects to the extent that they do not depart from the spirit of the invention. For example, the following variations are possible.

H1. First Variation

In the first embodiment described above, the number of laser light emission modules in the external-cavity laser light source apparatus is two, while the number is our in the second embodiment. However, the number of laser light emission modules in the external-cavity laser light source apparatus is not limited to two or four, but may be any number that is at least two. For example, it is possible to employ a configuration having four sets of two laser light emission modules facing each other, that is, eight laser light emission modules in total. It is also possible to employ a configuration in which some of a plurality of laser light emission modules do not have their counterparts. For example, in a configuration in which the external-cavity laser light source apparatus has four laser light emission modules, two of the four laser light emission modules are disposed in such a way that they face each other, while the other two are disposed in such a way that they do not face each other. In a configuration in which at least two laser light emission modules face each other, the distances among the laser light beams emitted outside can be reduced as compared to a configuration in which no laser light emission module faces any of the other modules. Further, the two laser light emission modules facing each other can share the prism for deflecting the light W5a (W5b), allowing reduction in the size of the whole external-cavity laser light source apparatus.

H2. Second Variation

In the embodiments described above, although the optical axis of the light R2a (R2b) wavelength-converted along the return path in the external resonance is bent by 90 degrees at the deflection mirror 120a (120b), the angle by which the optical axis is bent is not limited to 90 degrees, but may be an arbitrary angle. In this case, for example in the first embodiment, the position of the exit window 160a (160b) may be shifted in such a way that the optical axis bent at the deflection mirror 120a (120b) passes that position. Further, the prism 200 may be replaced with a prism having an appropriately angled side surface at which the light R5a (R5b) that exits through the exit window 160a is deflected off in the same direction as the light W3a (W3b). Moreover, the wavelength-converted light R2a and R2b may be bent at different angles. As understood from the foregoing description, by bending the optical axis at the deflection mirrors 120a and 120b in such a way that the wavelength-converted light R2a and R2b approach each other; the distances among the light beams (W4a, W4b, W7a, and W7b) that exit from the laser light emission modules 100a and 100b can be reduced to relatively small values. The size of the optical system downstream of the laser light emission modules 100a and 100b can thus be reduced.

H3. Third Variation

In the first embodiment described above, although the prism 200 is used to deflect the reflected light R5a (R5b) in the same direction as the light W3a (W3b), the deflection device is not limited to the prism 200 but may be any of other deflection devices. For example, a reflective plate formed of a planar plate-like glass substrate having a reflective film formed thereon may be prepared for each of the laser light emission modules 100a and 100b and used as the deflection device.

H4. Fourth Variation

In the embodiments described above, although each of the laser elements 111a and 111b provided in the external-cavity laser light source apparatuses 1000, and 1000a to 1000d is a vertical cavity surface emitting laser (VCSEL) element, the VCSEL may be replaced with an edge emitting type laser element in which the light resonating direction is parallel to the substrate surface. Further, the light source may not be formed of an internal resonance semiconductor laser, but may be formed of a non-internal resonance laser apparatus that emits a solid state laser beam or a gas laser beam. For example, when the light source is formed of a YAG (Yttrium Aluminum Garnet) laser apparatus, the light (corresponding to the fundamental wave light in the claims) obtained by irradiating a YAG crystal laser rod with the light from an excitation light source (semiconductor laser, for example) resonates in an external cavity for amplified emission. In such a configuration as well, the light wavelength-converted along the return path in the external resonance can be used as external emission (illumination), allowing efficient use of the wavelength-converted light.

H5. Fifth Variation

The embodiments described above, although the laser light emission module 100a (100b) has a plurality of laser elements 111a (111b) arranged in an array, it may have one laser element. Even in such a configuration, by providing a plurality of laser light emission modules, the whole external-cavity laser light source apparatus can emit high-output laser light beams, the distances among which are relatively small.

H6. Sixth Variation

In the fourth embodiment described above, although in each of the laser light emission modules 100a and 100b, the light W5a (W5b) deflected off the deflection mirror 120a (120b) travels along the light path that does not pass through the wavelength converter 130a (130b), only one of the laser light emission modules 100a and 100b may have a configuration in which the light W5a (W5b) travels along the light path that does not pass through the wavelength converter 130a (130b). That is, in the configuration in which the external-cavity laser light source apparatus has a plurality of laser light emission modules, at least one of the plurality of laser light emission modules is configured in such a way that the light coming from the opposite laser light emission module 100 travels along the light path that does not pass through the wavelength converter 130, thus preventing reduction in light usage efficiency.

H7. Seventh Variation

In the seventh embodiment described above, although the light modulation means used in the projector 500 is liquid crystal light valves, the light modulation means is not limited thereto. For example, the light modulation means may be any other modulation means, such as a DMD (Digital micromirror Device: a trademark of Texas Instruments, USA). The laser light source apparatuses 1000 and 1000a to 1000d in the first to fifth embodiments described above can be used not only in a monitoring apparatus (sixth embodiment) and a projector (seventh embodiment) but also in any devices that require a light source, such as an illumination apparatus.

The entire disclose of Japanese Patent Application No. 2006-349722, filed Dec. 26, 2006 is expressly incorporated by reference herein.

What is claimed is:

1. An external-cavity laser light source apparatus comprising:
   a plurality of laser light emission modules, each including
      a first mirror for resonance,
      a second mirror for resonance, the second mirror reflecting fundamental wave light for external resonance toward the first mirror, a lasing medium disposed between the first mirror and the second mirror, the lasing medium emitting the fundamental wave light, a wavelength converter disposed between the lasing medium and the second mirror, the wavelength converter performing wavelength conversion on the incident fundamental wave light to produce first converted light that has undergone the wavelength conversion and non-converted light that has not undergone the wavelength conversion, and a third mirror disposed between the lasing medium and the wavelength converter, the third mirror reflecting second converted light in a predetermined direction to produce reflected, converted light, the second converted light being wavelength-converted light produced when the non-converted light is reflected off the second mirror and incident again on the wavelength converter, the plurality of laser light emission modules being disposed in such a way that the first converted light beams exit from the laser light emission modules in the same direction and the reflected, converted light beams that exit from the laser light emission modules approach each other, the external-cavity laser light source apparatus further comprising:

a deflector that deflects the reflected, converted light beams that exit from the laser light emission modules in the same exit direction as the first converted light, the plurality of laser light emission modules being disposed on opposite sides of the deflector.

2. The external-cavity laser light source apparatus according to claim 1, the deflector being provided separately from the plurality of laser light emission modules, and the deflector having a plurality of deflection surfaces and causing the reflected, converted light beams that exit from the plurality of laser light emission modules to be deflected off the different deflection surfaces in the same exit direction as the first converted light.

3. The laser light emission module used in the external-cavity laser light source apparatus according to claim 1.

* * * * *

UNITED STATES PATENT AND TRADEMARK OFFICE
CERTIFICATE OF CORRECTION

| | |
|---|---|
| PATENT NO. | : 7,586,971 B2 |
| APPLICATION NO. | : 11/958456 |
| DATED | : September 8, 2009 |
| INVENTOR(S) | : Takashi Takeda |

It is certified that error appears in the above-identified patent and that said Letters Patent is hereby corrected as shown below:

On The Title Page please add the following:

Item
--(30) Foreign Priority Claimed

JP-A-2006-349722, filed Dec. 26, 2006.--

Signed and Sealed this

Twenty-ninth Day of December, 2009

David J. Kappos
*Director of the United States Patent and Trademark Office*